United States Patent
Then et al.

(10) Patent No.: US 10,665,577 B2
(45) Date of Patent: May 26, 2020

(54) CO-INTEGRATED III-N VOLTAGE REGULATOR AND RF POWER AMPLIFIER FOR ENVELOPE TRACKING SYSTEMS

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US); Seung Hoon Sung, Portland, OR (US); Sanaz Gardner, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/777,500

(22) PCT Filed: Dec. 21, 2015

(86) PCT No.: PCT/US2015/066983
§ 371 (c)(1),
(2) Date: May 18, 2018

(87) PCT Pub. No.: WO2017/111884
PCT Pub. Date: Jun. 29, 2017

(65) Prior Publication Data
US 2018/0331082 A1    Nov. 15, 2018

(51) Int. Cl.
*H01L 27/10*    (2006.01)
*H01L 25/16*    (2006.01)
(Continued)

(52) U.S. Cl.
CPC .......... *H01L 25/16* (2013.01); *H01L 21/8258* (2013.01); *H01L 23/66* (2013.01);
(Continued)

(58) Field of Classification Search
None
See application file for complete search history.

(56) References Cited

U.S. PATENT DOCUMENTS

| | | |
|---|---|---|
| 2003/0141518 A1 | 7/2003 | Yokogawa et al. |
| 2008/0070355 A1 | 3/2008 | Lochtefeld et al. |

(Continued)

FOREIGN PATENT DOCUMENTS

WO    2017/111884 A1    6/2017

OTHER PUBLICATIONS

International Search Report and Written Opinion received for PCT Application No. PCT/US2015/066983, dated Aug. 31, 2016. 13 pages.

(Continued)

*Primary Examiner* — Hung K Vu
(74) *Attorney, Agent, or Firm* — Finch & Maloney PLLC

(57) ABSTRACT

Techniques are disclosed for forming monolithic integrated circuit semiconductor structures that include a III-V portion implemented with III-N semiconductor materials, such as gallium nitride, indium nitride, aluminum nitride, and mixtures thereof. The disclosed semiconductor structures may further include a CMOS portion implemented with semiconductor materials selected from group IV of the periodic table, such as silicon, germanium, and/or silicon germanium (SiGe). The disclosed techniques can be used to form highly-efficient envelope tracking devices that include a voltage regulator and a radio frequency (RF) power amplifier that may both be located on the III-N portion of the semiconductor structure. Either of the CMOS or III-N portions can be native to the underlying substrate to some degree. The techniques can be used, for example, for sys- (Continued)

tem-on-chip integration of a III-N voltage regulator and RF power amplifier along with column IV CMOS devices on a single substrate.

20 Claims, 8 Drawing Sheets

(51) Int. Cl.

| | |
|---|---|
| H01L 23/66 | (2006.01) |
| H01L 21/8258 | (2006.01) |
| H01L 27/092 | (2006.01) |
| H01L 29/08 | (2006.01) |
| H01L 29/20 | (2006.01) |
| H01L 29/423 | (2006.01) |
| H01L 29/778 | (2006.01) |

(52) U.S. Cl.
CPC ...... *H01L 27/0922* (2013.01); *H01L 29/0847* (2013.01); *H01L 29/2003* (2013.01); *H01L 29/4236* (2013.01); *H01L 29/7786* (2013.01); *H01L 2223/6655* (2013.01); *H01L 2223/6677* (2013.01)

(56) References Cited

U.S. PATENT DOCUMENTS

| | | | |
|---|---|---|---|
| 2012/0305992 A1 | 12/2012 | Marino et al. | |
| 2013/0271208 A1* | 10/2013 | Then | H01L 25/072 327/541 |
| 2014/0091308 A1* | 4/2014 | Dasgupta | H01L 29/7784 257/76 |

OTHER PUBLICATIONS

International Preliminary Report on Patentability received for PCT Application No. PCT/US2015/066983, dated Jun. 26, 2018. 9 pages.

Then, et al., "High-Performance Low-Leakage Enhancement-Mode High-K Dielectric GaN MOSHEMTs for Energy-Efficient, Compact Voltage Regulators and RF Power Amplifiers for Low-Power Mobile SoCs," VLSI Symposium, Jun. 2015 at Kyoto, Japan. 2 pages.

* cited by examiner

CO-INTEGRATED III-N VOLTAGE REGULATOR AND RF POWER AMPLIFIER FOR ENVELOPE TRACKING SYSTEMS

BACKGROUND

Radio frequency (RF) receivers are used in many applications, such as mobile communication devices (e.g., cell phones) and wi-fi receivers. A typical RF receiver includes an antenna operatively coupled to a so-called RF frontend. Although RF frontends can have any number of configurations, one typical example generally includes an impedance matching circuit to facilitate power transfer from the antenna to the RF frontend, a filter to remove or otherwise degrade out-of-band signals and image frequency response, an RF amplifier (e.g., a low-noise amplifier, or LNA) configured to amplify in-band signal, and a mixer configured to mix the incoming RF signal with the signal from a local oscillator to down convert that RF input signal to the intermediate frequency. In some cases, the intermediate frequency can then be digitized by an analog to digital converter. The digital signal can then be sampled, filtered, and demodulated into a message that can then be acted upon or otherwise used. In a more general sense, RF amplifiers convert lower-power RF signals into higher-power signals and can be used to transmit RF signals between mobile devices and base stations. However, inefficiencies in RF power amplifiers for mobile devices deplete battery life and inefficiencies in RF power amplifiers for base stations cause excess power consumption.

BRIEF DESCRIPTION OF THE DRAWINGS

FIG. 3' is a transmission electron microscopy (TEM) image illustrating a cross-sectional side view of an example III-N transistor formed in accordance with an embodiment of the present disclosure.

Figure 1:
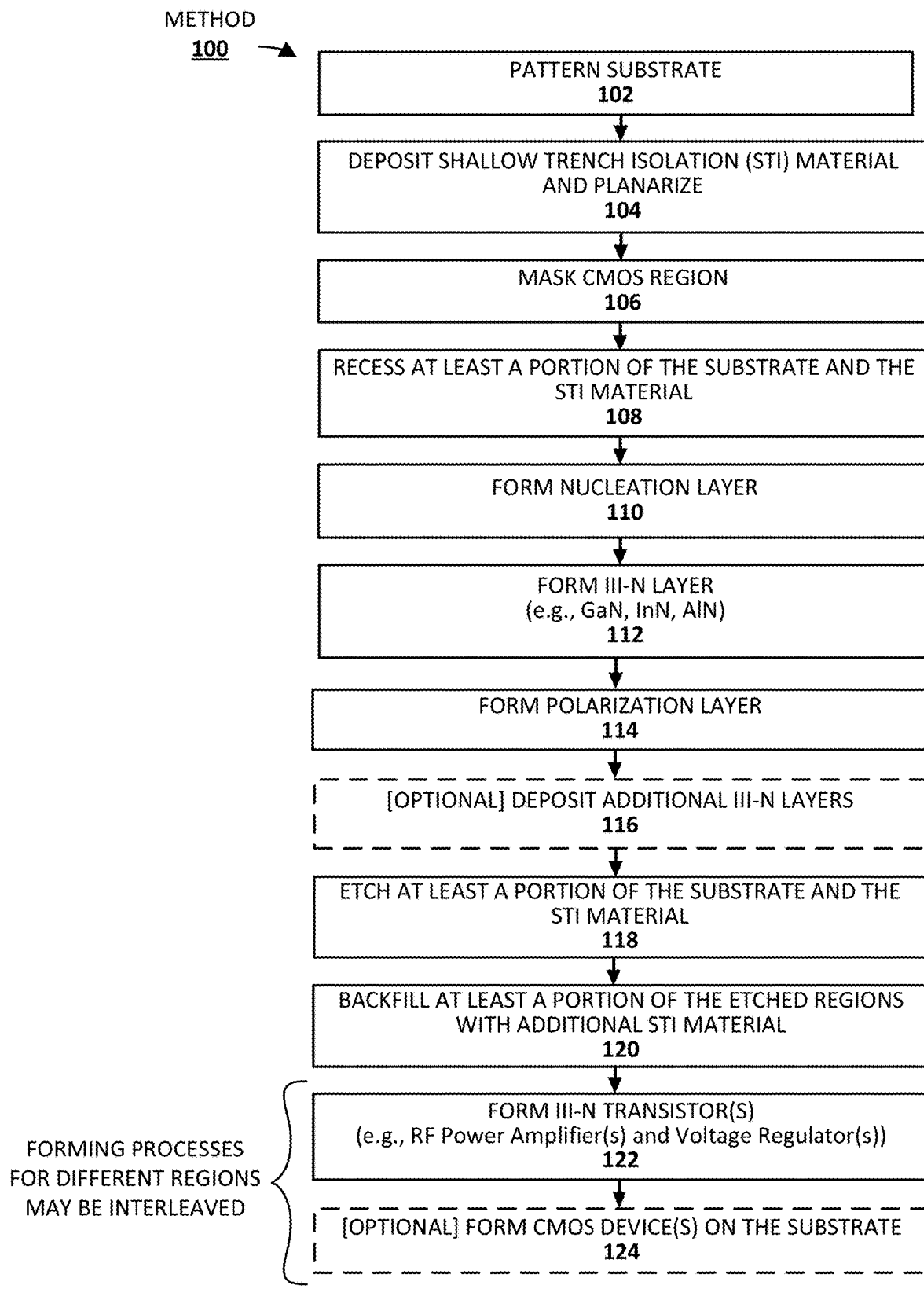
FIG. 1 illustrates an example methodology for producing an integrated circuit in accordance with one or more embodiments of the present disclosure.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming monolithic integrated circuit semiconductor structures that include a III-V material portion and may further include a complementary metal oxide semiconductor (CMOS) portion. In some embodiments, the III-V portion of the structure includes one or more III-nitride (III-N) materials, such as gallium nitride (GaN), aluminum nitride (AlN), and indium nitride (InN). In addition, a voltage regulator and a radio frequency (RF) power amplifier are formed on or from the III-N material portion. The voltage regulator and RF power amplifier may be configured to operate as an envelope tracking system for an RF frontend, according to some embodiments. The CMOS portion of the structure may include, for example, CMOS logic componentry implemented with a semiconductor substrate comprising a material selected from group IV of the periodic table, such as silicon, germanium, and/or silicon germanium (SiGe). In some such embodiments, the CMOS control logic componentry may be used in conjunction with the disclosed III-N voltage regulators and RF power amplifiers to provide envelope tracking systems. Either of the CMOS or III-V portions of the structure can be native to the underlying substrate to some degree. For instance, the substrate may be a silicon wafer upon which a voltage regulator, RF power amplifier and CMOS devices are formed. In one such example embodiment, the CMOS portion may be native to the substrate, but need not be. As will be appreciated in light of this disclosure, the techniques can be used, for example, for system-on-chip (SoC) integration of III-V material componentry (e.g., one or more GaN-based RF amplifiers and/or voltage regulators) along with column IV CMOS devices on a single substrate to provide highly efficient envelope tracking power amplification systems. In a more general sense, the techniques can be used for SoC integration of diverse III-V componentry on a single substrate, in accordance with some embodiments. Numerous other configurations and variations will be apparent in light of this disclosure.

General Overview

Envelope tracking techniques can improve the efficiency of RF power amplifiers by adjusting the voltage applied to an RF power amplifier to deliver the appropriate amount of power needed at a given instant. In an envelope tracking system, the power supply voltage to the power amplifier is continuously adjusted to track the envelope of the RF signal output by the amplifier, thereby ensuring that the amplifier is operating at its peak efficiency at all times. Specifically, envelope tracking techniques may reduce or eliminate excess power supplied to the power amplifier during moments when the signal is below its peak. Envelope tracking can thus significantly benefit power amplifiers carrying high peak to average power transmission ratios, such as 4G/LTE and 5G communication formats. Previous envelope tracking devices have employed a voltage regulator and an RF power amplifier that are each located on separate chips. Particularly, CMOS technology has been used to implement voltage regulators while gallium arsenide (GaAs) heterojunction bipolar transistors (HBTs) and high-electron-mobility transistors (HEMTs) have been used to implement RF power amplifiers. Implementation of RF power amplifiers using silicon can be problematic, as RF output power and efficiency is significantly degraded compared to implementation on GaAs. Moreover, direct battery connect voltage regulators implemented on silicon are limited to speeds of less than 20 MHz, and are therefore not effective at tracking envelope signals that exceed 100 MHz. As will be appreciated in light of this disclosure, III-V semiconductor materials, including III-nitride (III-N) materials, such as gallium nitride, aluminum nitride, indium nitride, aluminum indium nitride, aluminum gallium nitride and aluminum indium gallium nitride, may provide significant advantages to componentry, including both voltage regulators and RF power amplifiers. For instance, GaN voltage regulators may be capable of exceeding 100 MHz while also being able to handle voltage conversion for direct battery connection (e.g., 3.7V and higher). In addition, due to its wide bandgap and other properties such as high mobility, high electron saturation velocity and high thermal conductivity, GaN is also particularly well-suited for RF power amplifiers.

Thus, and in accordance with some embodiments of the present disclosure, techniques are provided for forming III-V transistor structures for highly efficient envelope-tracking RF power amplification applications. In some embodiments, a monolithic integrated circuit semiconductor structure is provided that includes both a voltage regulator and RF power amplifier. In some such embodiments, the voltage regulator and RF power amplifier components are implemented with column III-N semiconductor materials such as gallium nitride (GaN), indium nitride (InN), aluminum nitride (AlN), and compounds thereof. In some such embodiments, the monolithic integrated semiconductor structure includes components implemented on a complementary metal oxide semiconductor (CMOS) portion of the semiconductor structure in addition to components implemented on the III-N portion of the structure. The CMOS portion may include, for example, CMOS logic componentry implemented with semiconductor material selected from group IV of the periodic table, such as silicon (Si), germanium (Ge), and/or silicon germanium (SiGe). The disclosed techniques can be used, for example, for system-on-chip (SoC) integration of III-N transistors (e.g., voltage regulators and RF power amplifiers) along with column IV CMOS devices on a single substrate, in accordance with some embodiments. In this manner, the disclosed techniques can be used, for example, for SoC integration of envelope tracking systems that include CMOS control logic, one or more III-N voltage regulators and one or more III-N RF power amplifiers. Numerous configurations will be apparent.

Example Architecture and Methodology

Figure 2A:
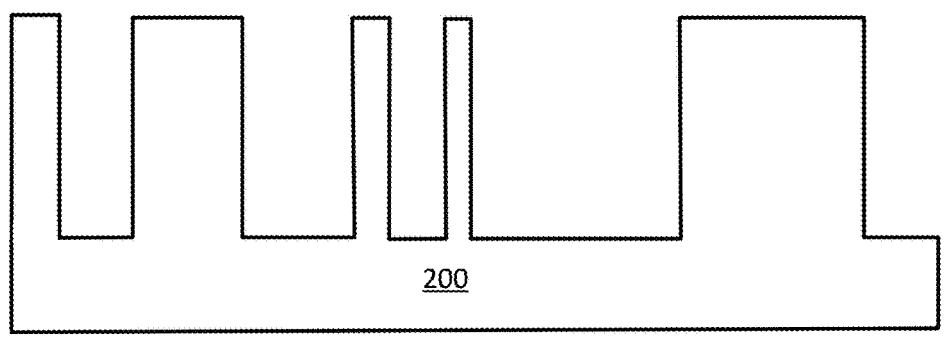
FIGS. 2A-2J illustrate cross-section side views of a series of integrated circuit structures that may be formed when carrying out the method of FIG. 1, in accordance with various embodiments of the present disclosure.

As shown in FIG. 1, method 100 includes patterning 102 a substrate 200 to form the resulting structure shown in FIG. 2A, in accordance with an example embodiment. Substrate 200 may be patterned by any suitable technique, including by masking, lithography and etching (wet and/or dry) processes. While the structure shown in FIG. 2A includes trenches and fins of specific dimensions, substrate 200 can be patterned to have trenches and fins of varying widths and heights, depending on the end use or target application. Similarly, although substrate 200 is shown with five trenches, any number of trenches may be formed, such as one, greater than one, two, ten, hundreds, thousands, millions, etc., depending on the end use or target application. Substrate 200 may comprise Si, SiGe, Ge, or any combination thereof, in some embodiments. In some particular embodiments, substrate 200 may be a bulk substrate of Si, SiGe or Ge. In select embodiments, substrate 200 is a bulk substrate of silicon having a (100) surface orientation or (110) or (111) orientation. In some embodiments, substrate 200 may be an X on insulator (XOI) structure where X comprises a semiconductor such as Si, SiGe, or Ge, and the insulator material is an oxide material or dielectric material or some other electrically insulating material or some other suitable multilayer structure where the top layer comprises Si, SiGe, or Ge. For example, in some embodiments, the substrate may be a bulk Si substrate with a buffer layer of SiGe or Ge on top of a portion of the bulk Si substrate, where that buffer layer can be used for substrate 200 as variously described herein. The bulk Si substrate may be of high resistivity (e.g., greater than 10 ohm-cm), in some example applications. In still other embodiments, the substrate 200 may be a III-V material substrate, such as gallium arsenide or gallium nitride or aluminum nitride. As will be appreciated in light of this disclosure, such a III-V material substrate 200 could be used to allow at least some of the componentry of the III-V portion of the monolithic structure to be native to the substrate 200.

Figure 2B:
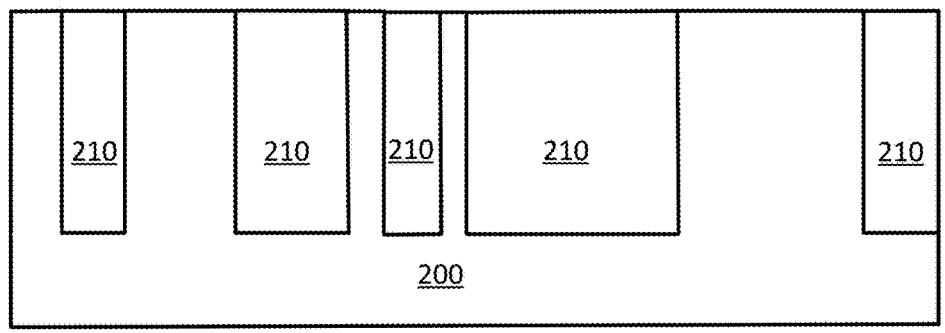

Method 100 of FIG. 1 continues with depositing 104 shallow trench isolation (STI) material 210 and planarizing to form the resulting example structure shown in FIG. 2B, in accordance with an example embodiment. STI material 210 may be deposited by any suitable technique, such as by chemical vapor deposition (CVD), atomic layer deposition (ALD), physical vapor deposition (PVD), or any other appropriate process. STI material 210 may comprise any suitable insulating material, such as one or more oxides (e.g., silicon dioxide) and/or nitrides (e.g., silicon nitride). In some embodiments, the STI material 210 may be selected based on the substrate material. For example, in the case of a silicon substrate 200, STI material 210 may be silicon dioxide or silicon nitride. Some embodiments may use a high-k dielectric to provide a greater degree of electrical isolation, if so desired. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the STI material 210 to improve its quality, particularly when a high-k dielectric material is used.

Figure 2C:
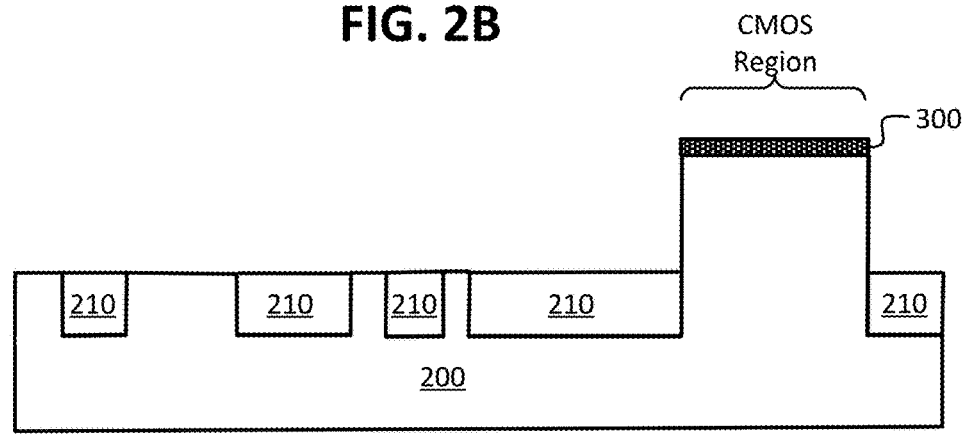

Method 100 of FIG. 1 continues with masking 106 the CMOS region with masking material 300 and recessing 108 at least a portion of the substrate 200 and the STI material 210 to form the resulting example structure shown in FIG. 2C, in accordance with an example embodiment. Note that the masked off portion of the substrate 200 is unaffected by the recessing process and can ultimately be used as the CMOS portion of the monolithic structure. Masking material 300 may comprise any suitable hardmask materials, such as various oxide or nitride materials, for example, such as silicon oxide, silicon nitride, titanium oxide, hafnium oxide, aluminum oxide, titanium nitride, or other suitable masking material. Substrate 200 and/or STI material 210 may be recessed by any suitable technique, such as by wet and/or dry etch processes. The etchants may be selected based on the materials of the substrate and/or STI material 210, as normally done.

Figure 2D:
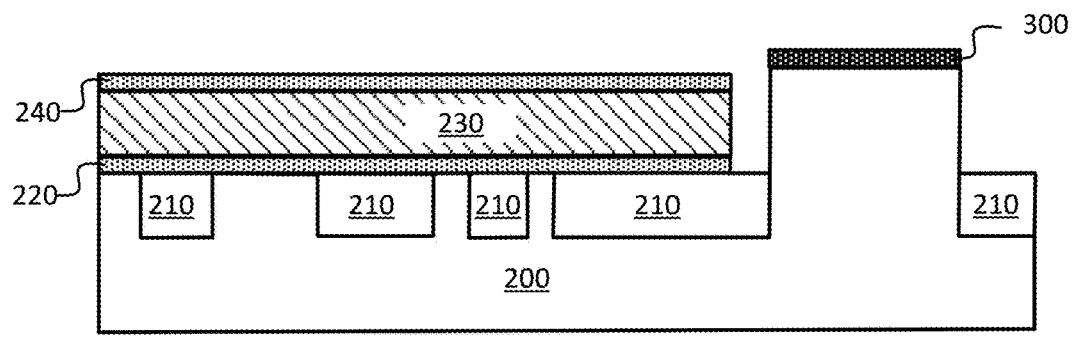

Method 100 of FIG. 1 continues with forming 110 a nucleation layer 220, forming 112 a III-N layer 230, and forming 114 a polarization layer 240 to produce the resulting example structure shown in FIG. 2D, in accordance with an example embodiment. In this example case, III-N layer 230 comprises gallium nitride (GaN), but other III-N materials can be used as well, such as aluminum nitride (AlN) or indium nitride (InN) or any number of III-N compounds. As will be appreciated in light of this disclosure, a III-N layer as described herein comprises at least one III-N compound. In some embodiments, nucleation layer 220 may comprise a III-V material, such as, for example, aluminum nitride (AlN), aluminum indium nitride (AlInN), aluminum gallium nitride (AlGaN), indium gallium nitride (InGaN), aluminum indium gallium nitride (AlInGaN), and/or gallium nitride (GaN), including a low temperature GaN (e.g., deposited at a temperature in the range of 700° C. to 950° C.). In some embodiments the nucleation layer 220 may have a thickness of less than 50 nm, such as approximately 20 nm, or any other suitable thickness depending on the end use or target application. In some embodiments the III-N layer 230 comprises at least 50%, at least 60%, at least 70%, at least 80%, at least 90%, at least 95%, or 100% GaN. In some embodiments, the III-N layer 230 may be approximately 1 micron in thickness (e.g., approximately 1 micron high when deposited) or less, or any other suitable thickness, although the thickness can vary from one embodiment to the next as will be appreciated in light of this disclosure. In some embodiments, the polarization layer 240 may comprise aluminum nitride (AlN), aluminum gallium nitride (AlGaN), indium aluminum nitride (InAlN), indium aluminum gallium nitride (InAlGaN), any mixture thereof, or any other suitable material, as will be apparent in light of this disclosure. In some embodiments, the polarization layer 240 may be less than 50 nm in thickness, such as approximately 20-30 nm, or any other suitable thickness depending on end use or target application. In some embodiments, nucleation layer 220 may prevent the III-N layer 230 from reacting with the substrate material (e.g., in the regions where the III-N layer 230 would otherwise be directly deposited on substrate 200).

In some embodiments, nucleation layer 220, III-N layer 230 and/or polarization layer 240 may be epitaxially grown, such as by liquid phase epitaxy (LPE), metal-organic chemical vapor deposition (MOCVD), molecular beam epitaxy (MBE), or any other suitable deposition process. In some embodiments, growth conditions may be adjusted based on the desired resulting characteristics of the layers. For example, in some cases where MOCVD is used, the temperature may be increased and/or the pressure may be decreased and/or the V:III ratio (e.g., the ratio of $N_2$ to Ga precursor gas flows) may be increased to cause the lateral component of layers 230 and 240 to grow faster, thereby maintaining the layers 230 and 240 as thin as possible in the vertical direction of the layer. In some embodiments, nucleation layer 220 may be formed prior to the formation of III-N layer 230. In some of these and other embodiments, polarization layer 240 may be formed subsequent to formation of III-N layer 230.

Method 100 of FIG. 1 continues with optionally depositing 116 one or more additional III-N layers. One or more additional III-N layers may be deposited directly on any of the III-N layers present. For example, an additional III-N layer may be deposited directly on III-N layer 230 or over III-N layer 230. In some specific embodiments, an additional III-N layer formed of AlN may be deposited on III-N layer 230 and polarization layer 240 may be deposited on the AlN layer. As will be appreciated in light of this disclosure, if present, the one or more additional III-N layers may be utilized in conjunction with III-N layer 230 to form multiple quantum-well (MQW) or super-lattice transistor structures, 3D polarization FETs, or 3 DEG transistors. For example, in some embodiments one or more additional sets of 2 DEG layers (e.g., a GaN layer and a polarization layer) can be deposited over the GaN layer and polarization layer. In some embodiments, one set, five sets, 10 sets, 100 sets, etc. of 2 DEG layers could be formed. In a more general sense, the various III-N layers provided can be used to fabricate III-N transistors, such as III-N RF power amplifiers and/or III-N voltage regulators, depending on the needs of the desired application.

Figure 2E:
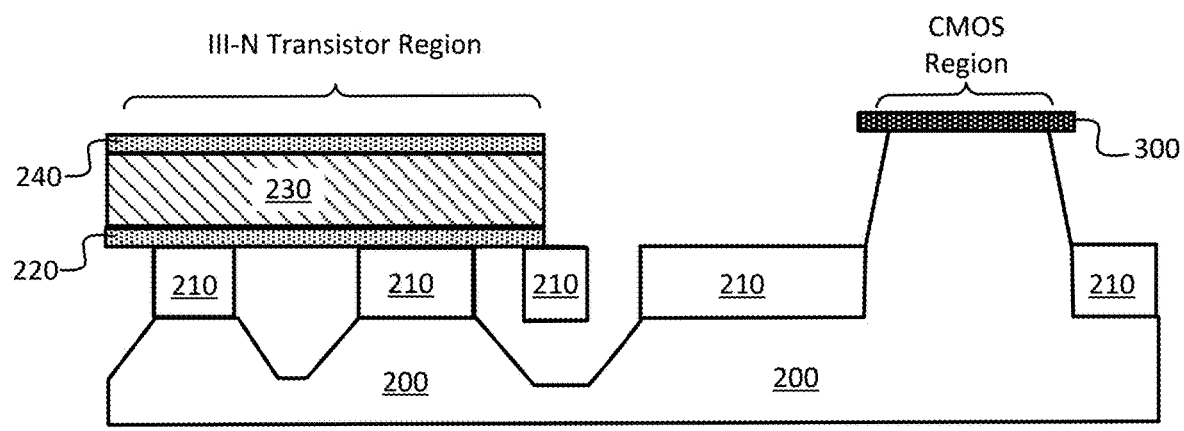

In some embodiments where diverse III-N componentry is to be fabricated (e.g., such as different types of GaN-based power transistors) on substrate 200, III-N layer 230 may be etched as well to define two or more distinct regions (one region for an RF power amplifier and voltage regulator, another region for CMOS devices and/or another region free from any such componentry), as shown in the example structure of FIG. 2E, in accordance with some example embodiments. The III-N layer 230 may be etched, for example, using a dry etch technique, such as using chlorine or fluorine-based chemistry, or with any other suitable etch scheme. As can be further seen in FIG. 2E, polarization layer 240 and/or nucleation layer 220 may also be etched along with III-N layer 230, depending on the end use or target application. In any such example cases, once the one or more III-N regions are defined, the individual regions can be individually modified or otherwise processed to fabricate the desired componentry of that region.

Method 100 of FIG. 1 continues with etching 118 at least a portion of the underlying substrate 200 and the STI material 210, in accordance with an example embodiment. An example resulting structure is shown in FIG. 2E, according to an embodiment. In some embodiments, etching 118 may be performed using a wet etch process to etch the substrate material 200 under III-N layer 230. In some such embodiments, the etchant may be selective to the substrate material 200, such that it either (1) removes the substrate material 200 without etching away the STI material 210 or any III-N material layers deposited above the STI material 210 (e.g., layers 230 and 240) or (2) etches away the substrate material 200 at a faster rate than it etches away the STI material 210 and/or the III-N material layers.

Figure 2F:
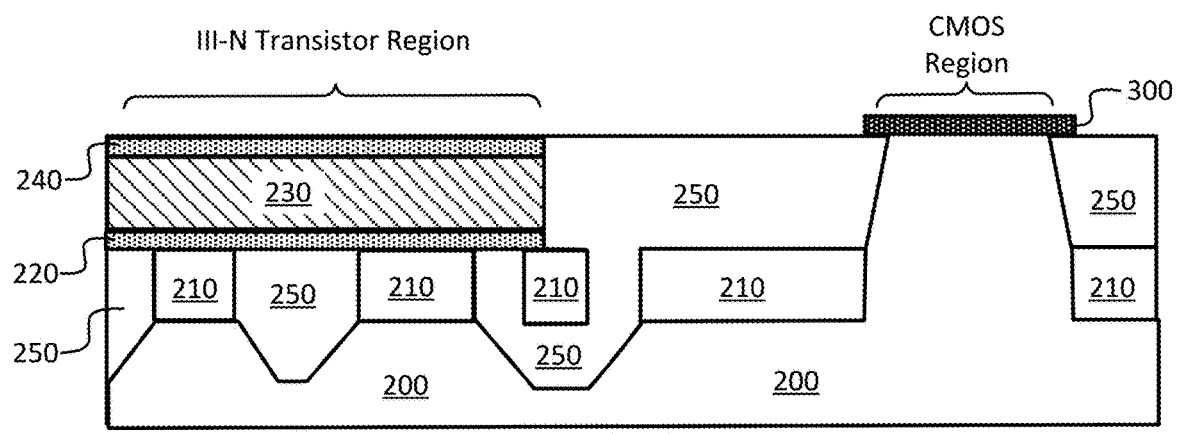

Method 100 of FIG. 1 continues with backfilling 120 at least a portion of the etched regions with additional STI material 250 to from an example structure as shown in FIG. 2F, in accordance with an example embodiment. Additional STI material 250 may be any suitable material, such as any material described above with respect to STI material 210. In some embodiments additional STI material 250 may be the same as STI material 210, while in other embodiments, additional STI material 250 may be different than STI material 210, depending on the end use or target application, including desired degree of electrical isolation. Backfilling 120 can be performed using any suitable technique, such as a spin-on process or other suitable process. In some cases, the additional STI material 250 may be reflowable, and can be subjected to high temperatures (e.g., 500-600 degrees Celsius) to facilitate a spin-based reflow backfill process.

Method 100 of FIG. 1 continues with forming 122 one or more III-N transistors in a first region of the structure and optionally forming 124 one or more CMOS devices in a second region of the structure, in accordance with some embodiments. Various different processes can be performed to form these different regions, and the various forming processes and steps may be interleaved, such that the distinct regions can be evolved toward completion together. In addition, once the various unique features of the distinct regions have been provisioned, the overall structure can be planarized and a contact forming process can be carried out for all the regions. Such an interleaved forming process is shown in the example embodiments depicted in FIGS. 2G through 2J. Numerous such embodiments and variations will be appreciated in light of this disclosure.

Figure 2G:
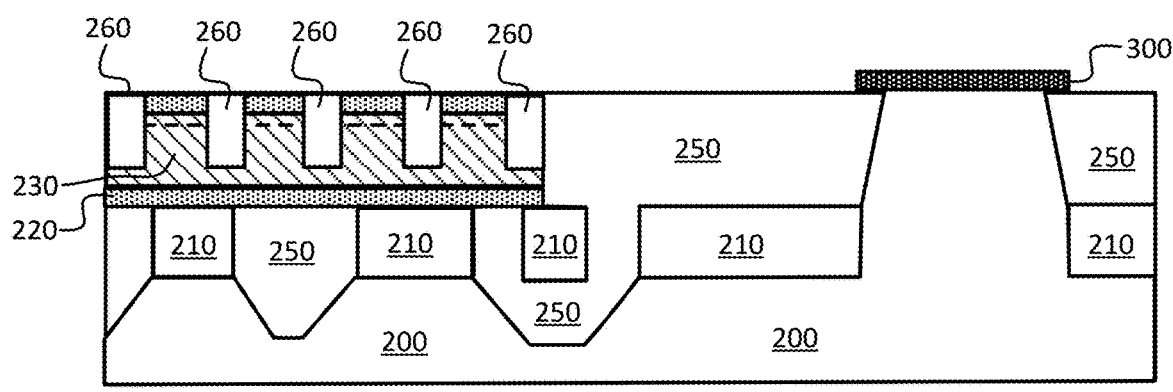

FIG. 2G illustrates a plurality of III-N transistors that include source and drain (S/D) regions 260, in accordance with an example embodiment. In this example embodiment, S/D regions 260 can be formed by masking the structure of FIG. 2F to isolate or otherwise leave exposed the areas where the S/D regions 260 will be located and a subsequent etching to remove materials in the exposed areas, including polarization layer 240 and at least a portion of III-N layer 230 to provide S/D trenches, followed by epitaxial regrowth of S/D material in those trenches to provide S/D regions 260. Further note the channel region between each S/D pair and proximate the interface of layer 230 and 240, generally indicated with a dashed line. As previously noted, the channel region may be a 2 DEG configuration, although other channel configurations can be used as well. Any suitable type of masking material may be used, including but not limited to $SiO_2$, SiN, or other types of dielectric/masking materials. The S/D material may be doped prior to deposition, during deposition (in situ), or after deposition (ion implantation) to provide the desired polarity of p-type or n-type. The doping can be graded within the deposited S/D material. In some specific embodiments, the III-N layer 230 is a GaN layer and the S/D material may be, for example, indium gallium nitride (InGaN) doped with Si to form n-type S/D regions 260. In still other such example embodiments, the S/D material may be n-type gallium nitride, n-type indium gallium nitride with a graded indium composition, or any other suitable S/D material as will be apparent in light of the present disclosure. After the S/D regions 260 are formed in the GaN or other suitable III-N layer 230, various other features such as spacer layer, barrier layers, gate stack, and contacts can subsequently be added as will be discussed in turn.

Additional features can be formed in the III-N transistor region, according to an embodiment. For instance, and with reference to the example embodiment shown in FIG. 2H, gates 280 and gate dielectric layer 281 for the one or more III-N transistors can be provided. In some embodiments, gate dielectric layer 281 is provided with etch and deposition processes that are selective to the underlying polarization layer 240, but can also be provided using a patterned mask that isolates the area above the channel. The gate dielectric layer 281 can be, for example, an AlN spacer and an AlGaN barrier layer to provide a 2 DEG configuration in conjunction with an underlying III-N layer 230 according to some embodiments, although any number of configurations can be employed to include a high-k dielectric, such as $HfO_2$, $TaSiO_x$, $ZrO_2$, $Al_2O_3$, lower-k dielectric, such as $SiO_2$, SiN and $AlSi_xO_y$, or configurations including composite stacks of high-k and low-k dielectrics, as will be appreciated. Further note that such a gate dielectric layer 281 can be provided at other points in the processing scheme. For instance, in another embodiment, the gate dielectric layer 281 can be provided prior to etching the S/D regions 260 or just after the S/D regions 260 are deposited. In any case, additional STI can be deposited over the overall structure including the spacer/barrier layer 281 and planarized, and then gates 280 can be patterned, etched, and deposited into the additional STI 250 as shown with further reference to FIG. 2H. Example gate 280 material may include, for instance, aluminum, titanium, titanium nitride, nickel, gold, tungsten, and other suitable gate metals and alloys thereof.

Figure 2H:
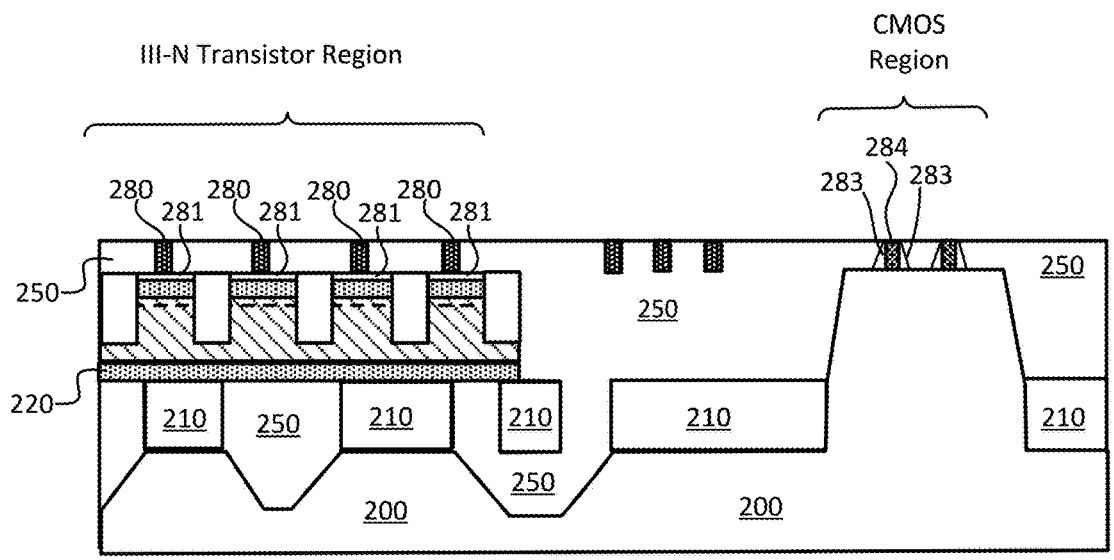

With respect to optionally forming 124 one or more CMOS devices on the substrate, CMOS gate structures can be formed, including gates stacks 284 and gate spacers 283, to produce a structure as shown in FIG. 2H, in accordance with an example embodiment. In some example embodiments, gate spacers 283 are formed and then used as a guide to form gate stack 284, which includes a gate electrode on a gate dielectric formed directly over a corresponding channel region in the substrate 200. The gate spacer, gate dielectric, and gate electrode may be formed using any suitable techniques (e.g., CVD, PVD) and from any suitable materials. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. Further, the gate electrode may comprise a wide range of materials, such as polysilicon, silicon nitride, silicon carbide, or various suitable metals or metal alloys, such as aluminum, tungsten, titanium, tantalum, copper, titanium nitride, or tantalum nitride, for example. The gate spacer 283 may be, for example, silicon nitride or silicon dioxide, or any other suitable CMOS gate spacer material.

In some embodiments, the formation of the gate stack 284 may include dummy gate oxide deposition, dummy gate electrode (e.g., poly-Si) deposition, and patterning hardmask deposition. Additional processing may include patterning the dummy gates and depositing/etching spacer 283 material. Following such processes, the method may continue with insulator deposition, planarization, and then dummy gate electrode and gate oxide removal to expose the underlying channel region, such as is done for a replacement metal gate (RMG) process. After opening the channel region in the CMOS region of substrate 200, the dummy gate oxide and electrode may be replaced with, for example, a gate dielectric and a replacement metal gate, respectively. Other embodiments may include a standard gate stack formed by any suitable process, such as a subtractive process where the gate dielectric/gate metal is deposited and then followed by one or more etching processes. This particular sequence of gate stack formation may also be applied to the formation of the III-N transistors.

Note that the CMOS region can be masked off when the gates 280 are formed in the III-N transistor region or other region, and the III-N transistor region can be masked off when the gate spacers 283 and/or gate stacks 284 are formed, according to some embodiments. However, in other embodiments, further note that the gates 280, spacers 283 and gate stacks 284 may be formed at least partially at the same time, such as the case where the recesses for gates 280 and gate spacer/stack 283/284 are patterned and etched in the same set of process steps. Then, selective depositions and further processing can be used to fill the recesses with the corresponding gate materials, as will be appreciated.

Figure 2I:
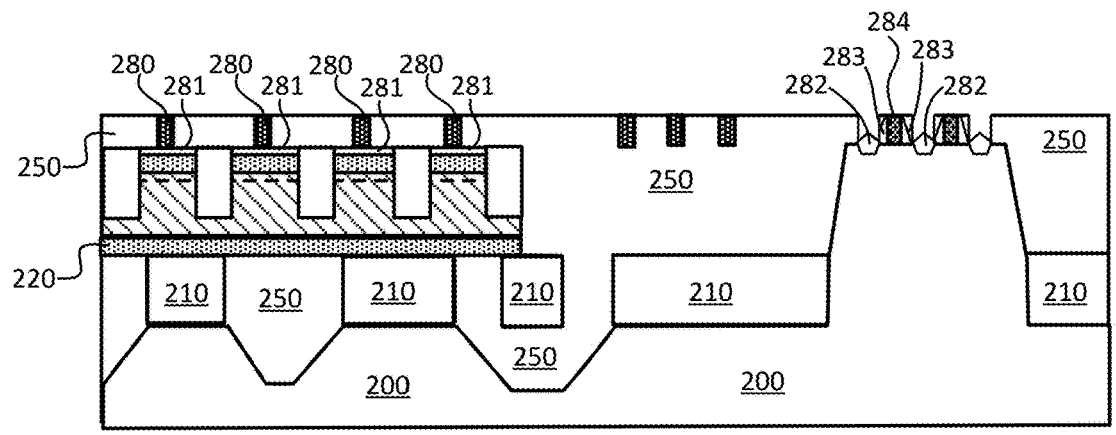

As further shown in FIG. 2I, method 100 of FIG. 1 continues with forming source and drain regions 282 for the CMOS region. According to some embodiments, the S/D regions 281 can be formed, for example, by patterning an appropriate mask and etching away STI material 250 as well as material of substrate 200 to each side of each channel region (and gate stack 284), followed by epitaxial regrowth of n-type S/D material. The S/D material may be, for example, silicon, germanium, or SiGe. The S/D material can be doped prior to deposition, during deposition (in situ), or after deposition (ion implantation) to provide the desired polarity of p-type or n-type. In still other embodiments, the S/D regions 282 can be formed, for example, by etching the STI 250 to expose the target S/D regions to each side of each gate stack 284, followed by ion implantation to dope the substrate 200 material as desired to form n-type and/or p-type S/D regions 282.

Figure 2J:
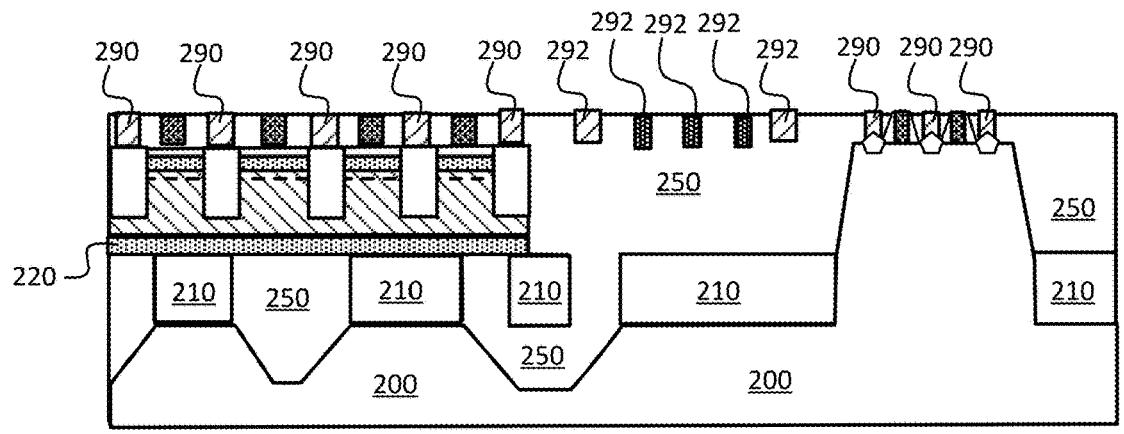

As further shown in FIG. 2J, trench contacts 290 may be simultaneously formed and metallized in various regions on the substrate, including the III-N transistor region and the CMOS region, according to some example embodiments. In alternative embodiments, the contacts 290 for the different regions can be formed separately, to accommodate different contact materials and/or forming processes, as needed. As shown in FIG. 2J, dummy metallization features 292 may be formed in regions other than the III-N transistor region and the CMOS region. Such dummy metallization features may be used, for example, to ensure uniform polish. Dummy metallization features 292 may be simultaneously formed with any metallized features in either the III-N transistor region or the CMOS region (e.g., with gates 280, gate stacks 284 and/or trench contacts 290). Any number of suitable patterning, etch, and deposition processes and material systems can be used to form trench contacts 290 and dummy metallization features 292. The contact 290 material or dummy metallization 292 material may be, for example, titanium, platinum, gold, aluminum, tungsten, silver, nickel, or other suitable contact metals and alloys thereof. In some embodiments, contacts 290 may include a stack of contact material layers, such as one or more work function tuning metal layers, nucleation layers, resistance reducing layers, liner or barrier layers, in addition to metal plug layers.

Note that the structures illustrated in FIGS. 2A-2J can be planar structures in some embodiments. In still other embodiments, the structures illustrated in FIGS. 2A-2J are non-planar structures such as fin-based structures, where the illustrated cross-section is taken parallel to the fin and through the fin. In such non-planar configurations, the fin may be implemented with one or more semiconductor materials arranged in a fin formation that extends from the substrate. The fin may be native to the substrate, or a deposition of material(s) on the fin. In one example embodiment, a given fin has a III-N portion (e.g., comprising one or more III-N materials) that includes the RF power amplifier/voltage regulator region and a column IV portion (e.g., comprising semiconductor material selected from group IV of the periodic table) that includes the CMOS region. As shown in the figures, an STI material can be used to isolate two distinct III-N and column IV fin portions. In still other embodiments, the non-planar fin configuration may be implemented with one or more nanowires (or nanoribbons, as the case may be) in the channel region in a so-called gate-all-around configuration. Numerous such non-planar configurations will be apparent in light of this disclosure, including FinFET, tri-gate, and nanowire configurations, in either or both of the III-N and CMOS IV transistors provisioned on the single substrate.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with an embodiment will show the III-N RF frontend componentry (e.g., GaN RF power amplifiers and GaN voltage regulators) and CMOS devices on a common substrate or wafer.

Example III-N Transistor Structures

Figure 3:
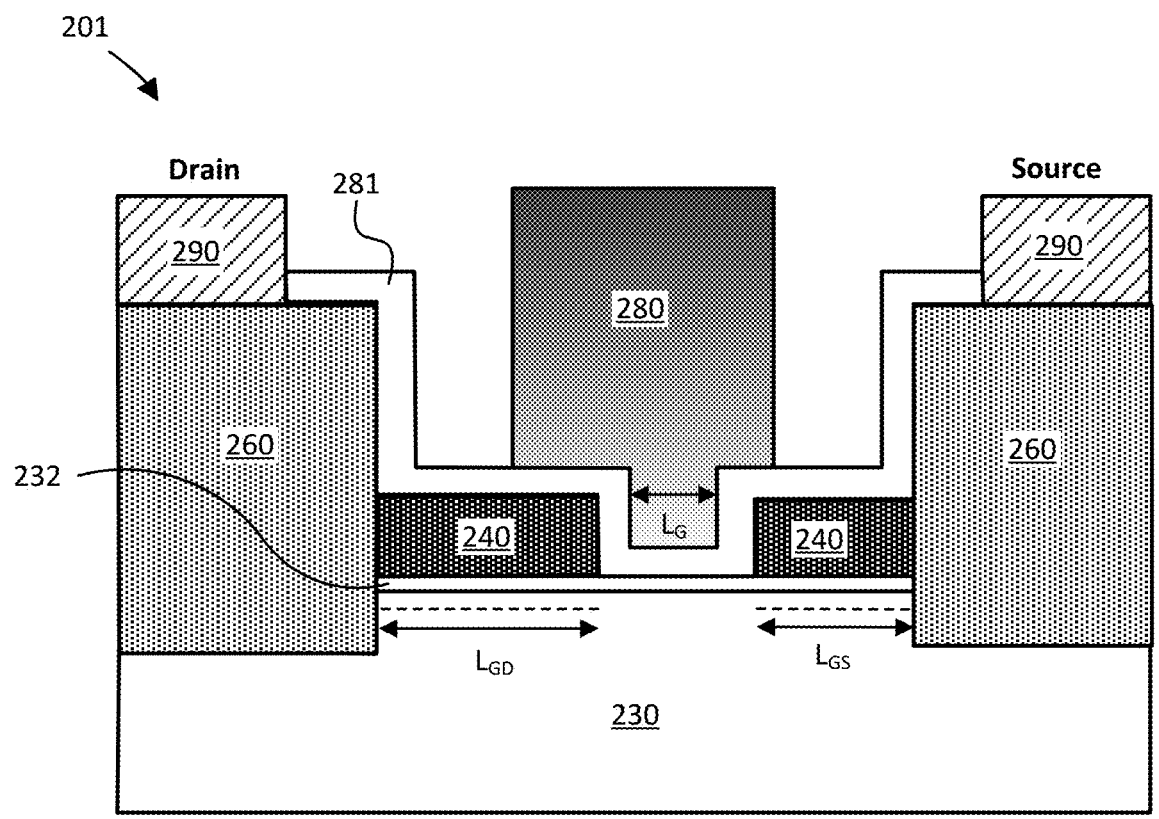
FIG. 3 illustrates a cross-section side view of an example transistor, configured in accordance with various embodiments of the present disclosure.
Figure 3:
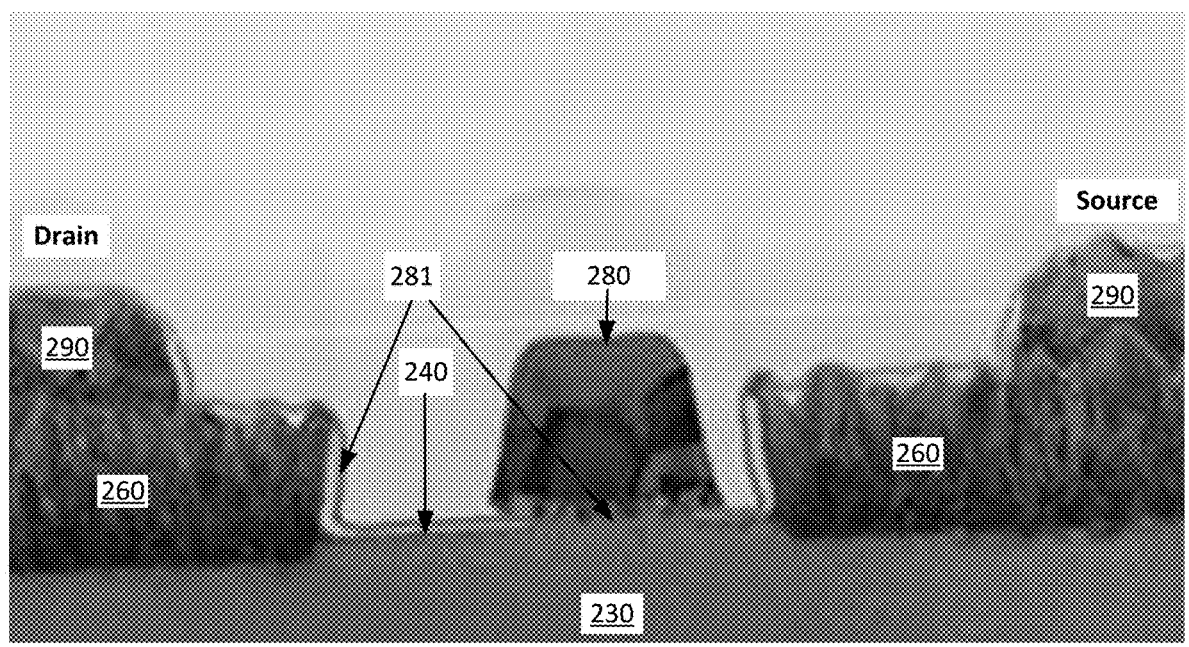

FIG. 3 illustrates one particular example III-N transistor structure 201 that may be used to implement envelope tracking techniques as variously described herein, in accordance with some example embodiments. Example transistor structure 201, as described herein, may be formed by any suitable method, including by methods detailed herein. In some embodiments, the III-N transistor structure 201 as disclosed herein may be used to implement, for example, a voltage regulator circuit and an RF power amplifier circuit for envelope tracking systems. In some particular embodiments, III-N transistor structure 201 may be a high-speed voltage regulator, capable of achieving speeds of greater than 100 MHz. It will be understood that the disclosed envelope tracking systems may include one or more example III-N transistor structures 201, as presently described.

The example III-N transistor structure 201 shown in FIG. 3 includes a III-N layer 230 and one or more additional III-N layers 232 on III-N layer 230. As will be appreciated, an additional III-N layer 232, if present, can be used as a lattice matching buffer layer between III-N Layer 230 and a next layer (e.g., polarization layer) to facilitate transition from one III-N compound to the next. Note that any of the III-N layers may have at least one of its elements graded, in some embodiments. The example III-N transistor structure 201 may also include polarization layers 240 and S/D regions 260, as shown in FIG. 3, in accordance with some example embodiments. The III-N transistor structure 201 may also include gate dielectric layer 281, gate 280 and contacts 290, as shown in FIG. 3.

As previously explained, the example III-N transistor structure 201 as herein described may be used to implement a voltage regulator and/or an RF power amplifier. In some embodiments, the voltage regulator and the RF power amplifier may be formed using the same materials or the structures may include compositionally different materials. Compositionally different generally refers to one III-N alloy being different from another III-N alloy. The difference may be, for example, with respect to different percentages (by weight) of a given component within the alloys, or a different component altogether that is in one alloy and not the other. Another example difference may be with respect to doping. In some specific example embodiments, the voltage regulator and the RF power amplifier may include different III-N materials in III-N layer 230 and/or additional III-N layer 232, as shown in FIG. 3. So, for instance, gallium nitride may be used to form III-N layer 230 of the voltage regulator, while aluminum nitride may be used to form III-N layer 230 of the RF power amplifier. Numerous variations and configurations will be apparent.

FIG. 3 shows the length of various features of example transistor structure 201. Specifically, FIG. 3 shows the gate ($L_G$), the length of the 2 DEG tip on the drain side ($L_{GD}$) and the length of the 2 DEG tip on the source side ($L_{GS}$). As will be appreciated in light of this disclosure, the 2 DEG tips may be formed using polarization layers 240, and in such embodiments, the length of the 2 DEG tips may be approximately equal to the length of the polarization layers. It will also be appreciated in light of this disclosure that the length of the gate $L_G$ may be approximately equal to the length of the channel. In a particular example III-N transistor, the III-N layer 230 may be formed of gallium nitride (GaN), an additional III-N layer 232 of AlN may be present and the polarization layers may be formed of AlInN. In this particular embodiment, S/D regions 260 may be formed of InGaN (e.g., InGaN doped with Si in doping amounts of around 2 E20 per cubic cm, to form n-type S/D regions). In some embodiments, the gate of the example III-N transistor may have an $L_G$ that is within the range of 40-150 nm. In some particular embodiments, the gate may have a length ($L_G$) of less than 100 nm. In some embodiments, the 2 DEG tips may have an $L_{GD}$ that is within the range of 40-250 nm and an $L_{GS}$ that is within the range of 5-100 nm. In some particular embodiments, the 2 DEG tips may have an $L_{GS}$ that less than the $L_{GD}$. For example, the $L_{GS}$ may be approximately 100 nm while the $L_{GD}$ may be approximately 230 nm. However, the present disclosure is not intended to be so limited. For example, in some embodiments, the gate and 2 DEG tips may have any suitable length and, in some embodiments, the 2 DEG tips may be equal (or approximately equal) or, in other cases, $L_{GS}$ may be greater than $L_{GD}$, depending on the end use or target application. Numerous embodiments and variations will be apparent in light of this disclosure.

FIG. 3' is a transmission electron microscopy (TEM) image illustrating a cross-sectional side view of an example III-N transistor formed in accordance with an embodiment of the present disclosure. As can be seen, the image illustrates gate 280 and gate dielectric layer 281 formed on III-N layer 230. Note the conformal nature of the gate dielectric 281, and how it extends from under gate 280 and continues such that it at least partially covers the source and drain regions 260 that extend upward from the III-N layer 230, in this example embodiment. Further note in this example embodiment how the sloped walls of the source drain regions 260 which extend upward from the III-N layer 230 tend to track with the sloped walls of the gate 280. Thus, the gate dielectric 281 is sloped as well, as it conforms to the sloped upwardly extending sidewalls of source and drain regions 260. As further shown in FIG. 3', polarization layer 240 is located between gate dielectric layer 281 and III-N layer 230 and although not visible in FIG. 3, an additional III-N layer 232 may be formed between polarization layer 240 and III-N layer 230.

Although the subject disclosure is not limited to III-N transistors that utilize gallium nitride, it will be understood that GaN RF power amplifiers and GaN voltage regulators may provide numerous advantages compared to transistors implemented using other materials. For example, voltage regulators implemented using GaN may be able to realize fast (e.g., greater than 100 MHz and in some cases greater than 150 MHz) switching frequencies. This is a significant improvement over voltage regulators implemented using silicon that cannot exceed 20 MHz. In addition to achieving higher speeds, voltage regulators implemented using GaN may also be capable of handling voltage conversion for direct battery connection (e.g., voltages of between 3.5-12V). Due at least in part to its wide band gap, gallium nitride also provides advantages to RF power amplifiers as compared to other materials. Specifically, GaN RF power amplifiers may be more efficient than RF power amplifiers implemented with silicon and other III-V materials, including gallium arsenide. As such, the disclosed techniques of forming GaN RF power amplifiers and GaN voltage regulators on a single substrate, which may be a column IV substrate, such as silicon, can provide highly efficient and scalable envelope-tracking systems.

Example Envelope-Tracking System Architecture

Figure 4:
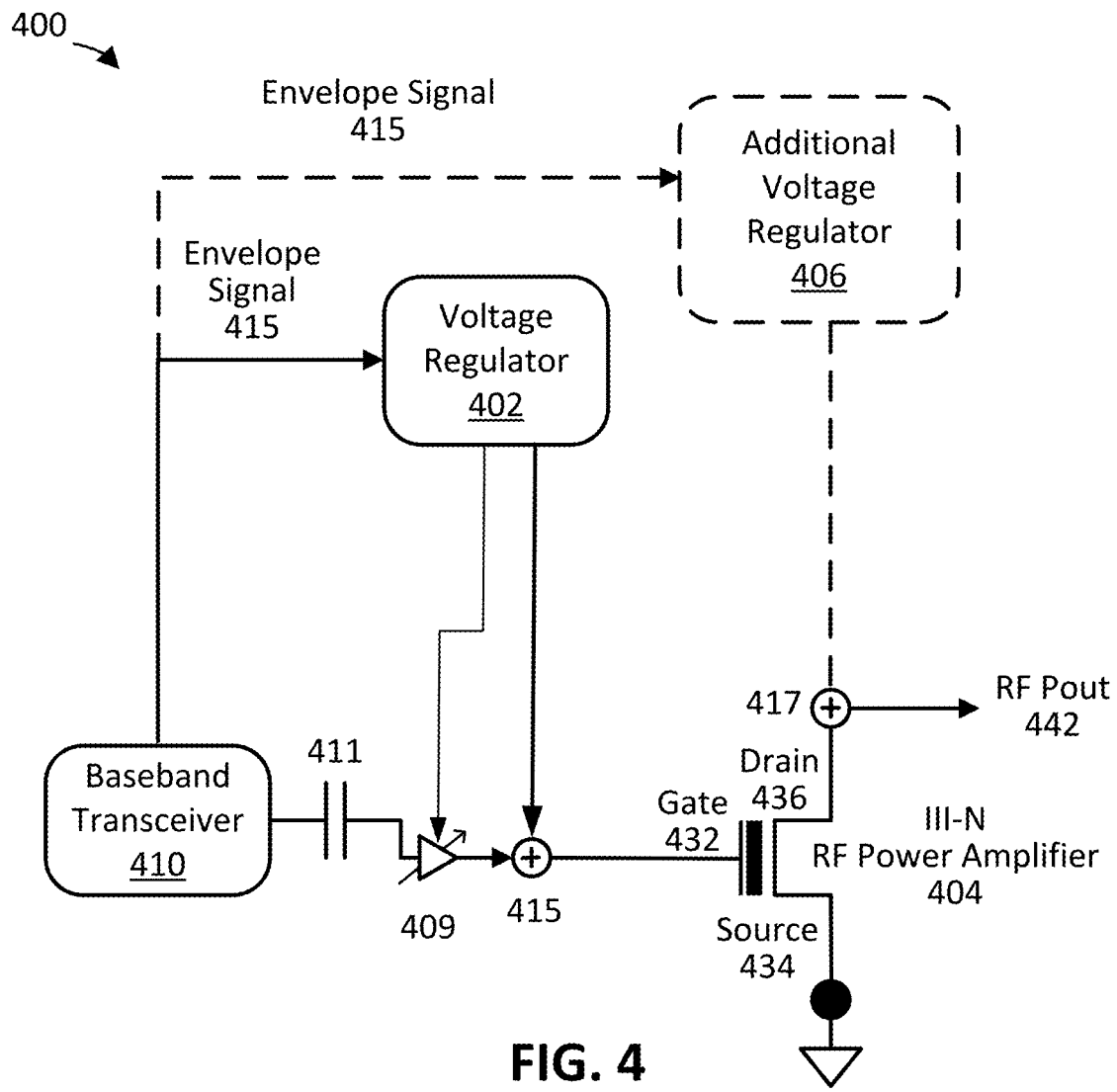
FIG. 4 illustrates an example envelope tracking system, configured in accordance with various embodiments of the present disclosure.

FIG. 4 illustrates an example envelope-tracking radio frequency (RF) power amplifier architecture 400, configured in accordance with some embodiments of the disclosure. Architecture 400 includes a III-N RF power amplifier 404, such as the one described herein with respect to FIG. 3. Architecture 400 also includes voltage regulator 402, which may be any high-speed voltage regulator (e.g., capable of operating at speeds of greater than 10, 20, 50, 100, or 150 MHz) and in some embodiments, is a III-N voltage regulator implemented with III-N transistors such as the one described herein with respect to FIG. 3. Voltage regulator 402 may be configured to modulate the input (Vgate) and output (Vdrain) biases of III-N RF power amplifier 404 to provide envelope-tracking capabilities. As shown, a transmitted RF envelope signal 415 may be fed to voltage regulator 402 from baseband transceiver 410. Baseband transceiver 410 may be implemented as normally done and configured in any communication format, including 2G, 3G, 4G, LTE and/or 5G.

In some embodiments, architecture 400 includes an optional additional envelope-tracking voltage regulator 406 configured to modulate the voltage of drain 436 (Vd). As will be appreciated in light of this disclosure, this additional voltage regulator 406 and the inputs/connections/outputs related thereto are shown in dashed lines in FIG. 4 to indicate that additional voltage regulator 406 is optional and need not be included in every embodiment. In some cases, modulating Vd in addition to modulating Vg of the III-N RF power amplifier 404 may lead to increased power amplifier efficiencies, such as increased PAE, for example. Additional voltage regulator 406, if present, may be any suitable type of voltage regulator, such as any voltage regulators discussed with respect to voltage regulator 402. In some embodiments, additional voltage regulator 406 may be a III-N voltage regulator implemented with III-N transistors such as the ones described herein with respect to FIGS. 3 and 3'. In some embodiments, additional voltage regulator 406 may be hard-coded or user-configurable, or some combination thereof. In some such embodiments, voltage regulator 406 may be configured to increase efficiency of III-N RF power amplifier 404 based on the baseband transceiver 410 architecture 400 is used with and/or based on the signals (e.g., envelope signal 415) that architecture 400 receives, for example.

As further shown in FIG. 4, architecture 400 can include other suitable componentry. For example, a capacitor 411 and variable gain amplifier 409 arrangement can be implemented between the baseband transceiver 410 and the gate of RF power amplifier 404, as is typically done. Furthermore, adder 415 may be used to sum the input from voltage regulator 402 and baseband transceiver 410 and, if present, adder 417 may be used to sum the input from additional voltage regulator 406 and drain 436. Numerous configurations will be apparent in light of this disclosure.

Example System

Figure 5:
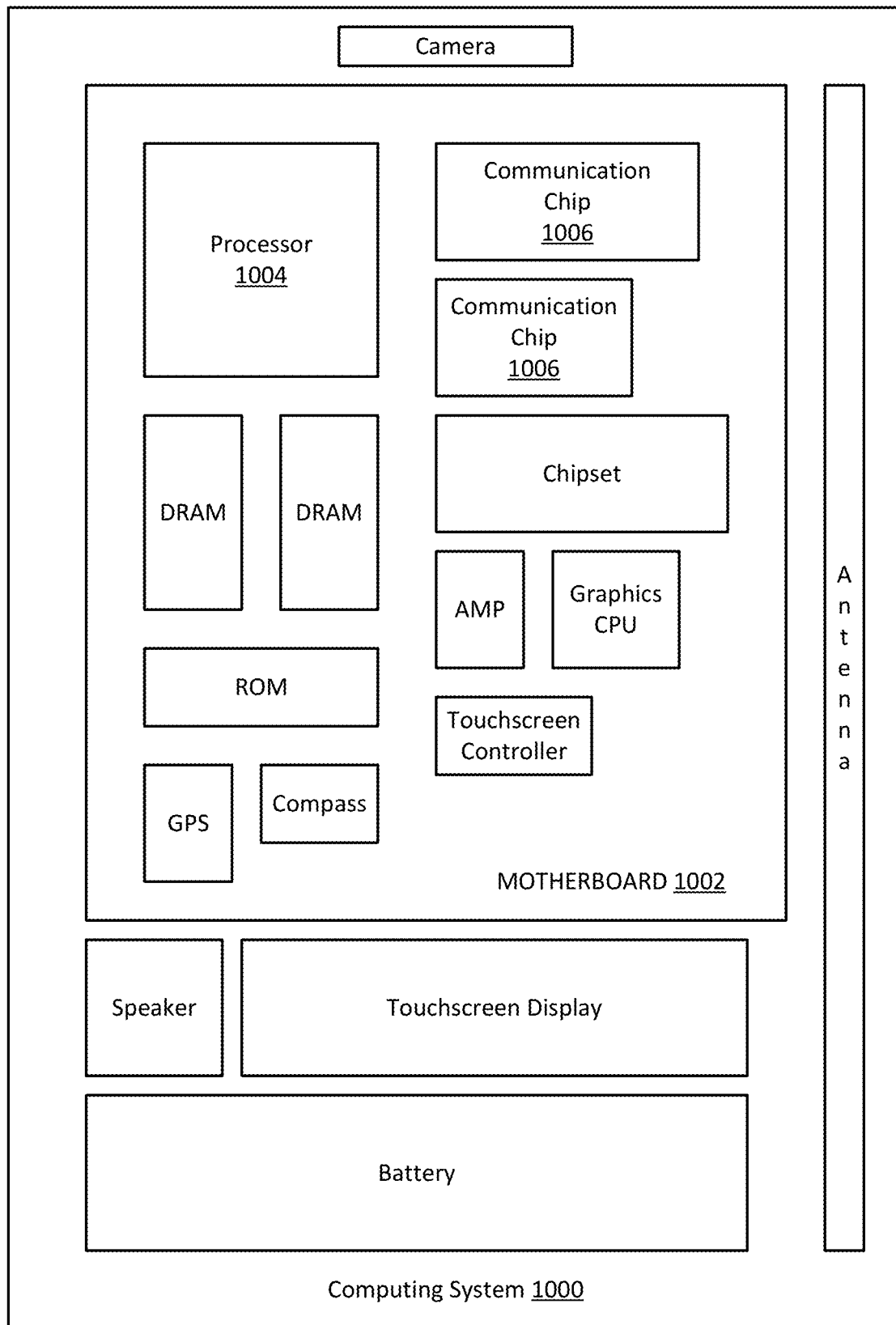
FIG. 5 illustrates an example computing system implemented with one or more integrated circuit structures or devices formed using the envelope-tracking techniques disclosed herein, in accordance with an embodiment of the present disclosure.

FIG. 5 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more envelope-tracking RF power amplifiers and/or voltage regulators, as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit that includes a semiconductor substrate including a material selected from group IV of the periodic table; a III-N layer over or in the substrate; a polarization layer over the III-N layer; and a voltage regulator at least partially formed within the III-N layer, the voltage regulator including: a gate stack that includes a gate dielectric and a gate electrode; source and drain (S/D) regions formed on or in the III-N layer; and metal contacts electrically connected to the S/D regions.

Example 2 includes the subject matter of Example 1, wherein the III-N layer includes gallium nitride (GaN).

Example 3 includes the subject matter of any of Examples 1-2, wherein the polarization layer has a length in a region between the gate and the source ($L_{GS}$) and a length in a region between the gate and the drain ($L_{GD}$), and the $L_{GS}$ is less than the $L_{GD}$.

Example 4 includes the subject matter of any of Examples 1-3, wherein the $L_{GS}$ is between 5 to 100 nm and the $L_{GD}$ is between 40 to 150 nm.

Example 5 includes the subject matter of any of Examples 1-4, wherein the gate has a length within the range of 40 to 150 nm.

Example 6 includes the subject matter of any of Examples 1-5 and further includes at least one additional III-N layer positioned between the III-N layer and the polarization layer.

Example 7 includes the subject matter of Example 6, wherein the additional III-N layer includes aluminum nitride.

Example 8 includes the subject matter of any of Examples 1-7, wherein the polarization layer includes a material selected from the group including aluminum nitride, aluminum gallium nitride, aluminum indium nitride and indium aluminum gallium nitride.

Example 9 includes the subject matter of any of Examples 1-8, wherein the S/D regions are formed of silicon-doped indium gallium nitride.

Example 10 includes the subject matter of any of Examples 1-9, wherein the gate dielectric continues outward from the gate stack such that it is further positioned above the polarization layer and S/D regions and is conformal to its underlying topography.

Example 11 includes the subject matter of any of Examples 1-10, wherein the substrate includes at least one material selected from the group consisting of silicon, silicon germanium (SiGe), and germanium.

Example 12 includes the subject matter of any of Examples 1-11, wherein the voltage regulator has a speed of at least 100 MHz at voltages of at least 3.5V.

Example 13 includes the subject matter of any of Examples 1-12, wherein the voltage regulator is electrically connected to a radio frequency (RF) power amplifier.

Example 14 includes the subject matter of Examples 13, wherein the voltage regulator is configured to modulate input and output biases of the RF power amplifier to provide envelope-tracking.

Example 15 includes the subject matter of any of Examples 13-14, wherein the III-N layer includes a first portion that includes the voltage regulator and a second portion that includes the RF power amplifier, and the first portion is compositionally different from the second portion.

Example 16 includes the subject matter of any of Examples 13-15, wherein the voltage regulator includes a transistor structure that is the same as a transistor structure of the power amplifier.

Example 17 includes the subject matter of any of Examples 13-16, wherein each of the RF power amplifier and the voltage regulator comprise gallium nitride (GaN).

Example 18 is system-on-chip comprising the integrated circuit of any one of Examples 1-17.

Example 19 is a mobile computing system that includes the integrated circuit of any one of Examples 1-17 or the system-on-chip of Example 16.

Example 20 is an integrated circuit that includes a semiconductor substrate including a material selected from group IV of the periodic table; a III-N region in or on the substrate that includes at least one voltage regulator and at least one radio frequency (RF) power amplifier; and a complementary metal oxide semiconductor (CMOS) device on a second region of the substrate.

Example 21 includes the subject matter of Example 20, wherein at least one of the voltage regulator and the RF power amplifier comprises a layer including gallium nitride (GaN).

Example 22 includes the subject matter of Example 21, wherein the layer including GaN includes at least 50% gallium nitride by weight.

Example 23 includes the subject matter of any of Examples 20-22, wherein the substrate comprises at least one material selected from the group consisting of silicon, silicon germanium (SiGe), and germanium.

Example 24 includes the subject matter of any of Examples 20-23, wherein at least one of the voltage regulator and the RF power amplifier includes a nucleation layer on the substrate.

Example 25 includes the subject matter of Example 24, wherein the nucleation layer includes at least one of: aluminum nitride, aluminum indium nitride, aluminum gallium nitride, indium gallium nitride, aluminum indium gallium nitride or gallium nitride.

Example 26 includes the subject matter of any of Examples 20-25, wherein at least one of the voltage regulator and the RF power amplifier comprises a polarization layer above a region comprising gallium nitride (GaN).

Example 27 includes the subject matter of Example 26, wherein the polarization layer includes at least one of aluminum nitride, aluminum gallium nitride, indium aluminum nitride or indium aluminum gallium nitride.

Example 28 includes the subject matter of any of Examples 26-27 and further includes at least one additional III-N layer positioned between the GaN region and the polarization layer.

Example 29 includes the subject matter of Example 28, wherein the at least one additional III-N layer includes aluminum nitride.

Example 30 includes the subject matter of any of Examples 20-29, wherein at least one of the voltage regulator, the RF power amplifier and the CMOS device includes a FinFET or a nanowire configuration.

Example 31 includes the subject matter of any of Examples 20-30, wherein the power amplifier comprises a geometry selected from the group consisting of a high-electron-mobility transistor (HEMT) architecture, a pseudo-morphic HEMT (pHEMT) architecture, a two-dimensional electron gas (2 DEG) architecture, a three-dimensional electron gas (3 DEG) architecture, a multiple quantum-well (MQW) architecture, and a super-lattice architecture.

Example 32 is a system-on-chip (SoC) comprising the integrated circuit of any of Examples 20-31.

Example 33 is a mobile computing system comprising the integrated circuit of any one of Examples 20-31 or the SoC of Example 32.

Example 34 is a method of forming a monolithic integrated circuit, the method including: providing a semiconductor substrate comprising a material selected from group IV of the periodic table; depositing a III-N layer on a first region of the substrate; forming at least one voltage regulator and at least one RF power amplifier on the III-N layer; and forming a CMOS device on a second region of the substrate.

Example 35 includes the subject matter of Example 34, wherein the III-N layer includes gallium nitride (GaN).

Example 36 includes the subject matter of any of Example 35, wherein forming the voltage regulator or forming the RF power amplifier includes depositing a polarization layer over the III-N layer and the polarization layer includes at least one of aluminum nitride, aluminum gallium nitride, indium aluminum nitride, or indium aluminum gallium nitride.

Example 37 includes the subject matter of any of Examples 34-36 and further includes depositing a nucleation layer on the substrate prior to depositing the III-N layer, wherein the nucleation layer includes at least one of: aluminum nitride, aluminum indium nitride, aluminum gallium nitride, indium gallium nitride, aluminum indium gallium nitride or gallium nitride.

Example 38 includes the subject matter of any of Examples 34-37 and further includes depositing a shallow trench isolation (STI) material on the substrate to isolate the III-N layer from the CMOS device.

Example 39 is an integrated circuit formed by the method of any one of Examples 34-38.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
    a first layer comprising a first III-N semiconductor material;
    a second layer distinct from and over the first layer, the second layer comprising a second III-N semiconductor material; and
    a circuit including a voltage regulator connected to a radio frequency (RF) power amplifier, the circuit including
        a gate stack above the first layer and comprising a gate dielectric and a gate electrode;
        a source region and a drain region each on the first layer; and
        first and second metal contacts, each on a respective one of the source and drain regions;
    wherein the first layer includes a first portion and a second portion, and wherein the first portion at least partially includes the voltage regulator and the second portion at least partially includes the RF power amplifier.

2. The integrated circuit of claim 1, wherein the first layer comprises gallium and nitrogen.

3. The integrated circuit of claim 1, wherein the second layer has a first length in a region between the gate stack and the source region and a second length in a region between the gate stack and the drain region, and the first length is less than the second length.

4. The integrated circuit of claim 1, further comprising at least one additional layer between the first layer and the second layer, wherein the additional layer comprises aluminum and nitrogen.

5. The integrated circuit of claim 1, wherein the second layer comprises a compound material that includes aluminum and nitrogen, or aluminum gallium and nitrogen, or aluminum indium and nitrogen, or indium aluminum gallium and nitrogen.

6. The integrated circuit of claim 1, wherein the source and drain regions comprise indium gallium nitrogen and silicon.

7. The integrated circuit of claim 1, wherein the gate dielectric continues outward from the gate stack such that it is above the second layer and above the source and drain regions, and is conformal to its underlying topography.

8. The integrated circuit of claim 1, further comprising a semiconductor substrate, wherein the substrate comprises at least one of silicon and germanium.

9. The integrated circuit of claim 1, wherein the first portion is compositionally different from the second portion.

10. The integrated circuit of claim 9, wherein the voltage regulator comprises a transistor structure that is the same as a transistor structure of the power amplifier.

11. A system-on-chip comprising the integrated circuit of claim 1.

12. The integrated circuit of claim 1, further comprising:
a semiconductor substrate comprising a material selected from group IV of the periodic table;
a complementary metal oxide semiconductor (CMOS) device above a first region of the substrate; and
the circuit being above a second region of the substrate, the first and second regions being spaced from one another.

13. The integrated circuit of claim 12, wherein each of the voltage regulator and the RF power amplifier includes at least one region that is part of the first layer and at least one region that is part of the second layer.

14. The integrated circuit of claim 12, wherein the substrate comprises at least one material selected from the group consisting of silicon, silicon germanium (SiGe), and germanium.

15. An integrated circuit, comprising:
a first layer comprising a first III-N semiconductor material;
a second layer distinct from and over the first layer, the second layer comprising a second III-N semiconductor material; and
a circuit including a voltage regulator and a RF power amplifier, the circuit including
a gate stack above the first layer and comprising a gate dielectric and a gate electrode;
a source region and a drain region each on the first layer; and
first and second metal contacts, each on a respective one of the source and drain regions;
wherein the second layer has a first length in a region between the gate stack and the source region and a second length in a region between the gate stack and the drain region, and the first length is different from the second length.

16. The integrated circuit of claim 15, wherein the first layer comprises gallium and nitrogen, the second layer comprises aluminum indium and nitrogen, and the source and drain regions each comprises indium gallium and nitrogen.

17. The integrated circuit of claim 16, further comprising at least one additional layer positioned between the first layer and the second layer, wherein the additional layer comprises aluminum and nitrogen.

18. The integrated circuit of claim 15, further comprising a complementary metal oxide semiconductor (CMOS) device.

19. An integrated circuit, comprising:
a first layer comprising a first III-N semiconductor material;
a second layer distinct from and over the first layer, the second layer comprising a second III-N semiconductor material; and
a circuit including a voltage regulator and a RF power amplifier, the circuit including
a gate stack above the first layer and comprising a gate dielectric and a gate electrode;
a source region and a drain region each on the first layer; and
first and second metal contacts, each on a respective one of the source and drain regions;
wherein the second layer has a first length in a region between the gate stack and the source region and a second length in a region between the gate stack and the drain region, and the first length is different from the second length;
wherein each of the voltage regulator and the RF power amplifier includes at least one region that is part of the first layer and at least one region that is part of the second layer; and
wherein the gate dielectric continues outward from the gate stack such that it is further positioned above the second layer and also above the source and drain regions, and is conformal to its underlying topography.

20. The integrated circuit of claim 19, wherein the first layer comprises gallium and nitrogen, the second layer comprises aluminum indium and nitrogen, and the source and drain regions each comprises indium gallium and nitrogen, the integrated circuit further comprising a complementary metal oxide semiconductor (CMOS) device that includes at least one of silicon and germanium.

* * * * *